(12) United States Patent
King et al.

(10) Patent No.: US 7,759,262 B2
(45) Date of Patent: Jul. 20, 2010

(54) SELECTIVE FORMATION OF DIELECTRIC ETCH STOP LAYERS

(75) Inventors: Sean King, Beaverton, OR (US); Jason Klaus, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/165,515

(22) Filed: Jun. 30, 2008

(65) Prior Publication Data
US 2009/0321795 A1    Dec. 31, 2009

(51) Int. Cl.
*H01L 21/28* (2006.01)
*H01L 29/423* (2006.01)
(52) U.S. Cl. .......... 438/785; 257/E21.19; 257/E29.128
(58) Field of Classification Search .................. 438/775, 438/785; 257/E21.19, E29.128
See application file for complete search history.

(56) References Cited

U.S. PATENT DOCUMENTS

| | | | |
|---|---|---|---|
| 2005/0082625 A1* | 4/2005 | Kim et al. | 257/412 |
| 2008/0251922 A1* | 10/2008 | Shih et al. | 257/754 |
| 2008/0251928 A1* | 10/2008 | Chang et al. | 257/762 |

OTHER PUBLICATIONS

Barsotti, R. J., et al., "Imaging, Structural, and Chemical analysis of Silicon Nanowires", *Appl. Phys. Lett. 81*, (2002), 2866.

Cui, Y., et al., "Diameter controlled synthesis of single crystal silicon nanowires", *Phys. Rev. B 73*, (2006), 2214.

Schubert, L., et al., "Silicon Nanowhiskers grown on <111> substrates by Molecular Beam Epitaxy", *Appl. Phys. Lett. 85*, (2004), 4968.

Sunkara, M. K., et al., "Bulk Synthesis of Silicon Nanowires using a low-temperature VLS method", *Appl. Phys. Lett. 79*, (2001), 1546.

Chen, X , et al., "Rational growth of highly oriented amorphous silicon nanowire films", *Chem. Phys. Lett. 374*, (2003), 626.

Christiansen, S , et al., "VLS growth of silicon nanowires by CVD on Implanted Templates", *J. Appl. Phys. 100 084323*, (2003).

Dujardin, R , et al., "Growth mechanism of Si nanowhiskers and SiGe heterostructures in Si nanowiskers: X-ray scattering and electron microscopy investigations", *Appl. Phys. Lett. 98 153129*, (2006).

(Continued)

*Primary Examiner*—David Vu
*Assistant Examiner*—Earl N Taylor
(74) *Attorney, Agent, or Firm*—Blakely, Sokoloff, Taylor & Zafman LLP

(57) ABSTRACT

Methods to selectively form a dielectric etch stop layer over a patterned metal feature. Embodiments include a transistor incorporating such an etch stop layer over a gate electrode. In accordance with certain embodiments of the present invention, a metal is selectively formed on the surface of the gate electrode which is then converted to a silicide or germanicide. In other embodiments, the metal selectively formed on the gate electrode surface enables a catalytic growth of a silicon or germanium mesa over the gate electrode. At least a portion of the silicide, germanicide, silicon mesa or germanium mesa is then oxidized, nitridized, or carbonized to form a dielectric etch stop layer over the gate electrode only.

19 Claims, 7 Drawing Sheets

OTHER PUBLICATIONS

Fan, S , "Growth of Semiconductor Nanowires on Iron-Patterned Silicon Substrates", *Mat. Sci. Engr. 15*, (2001), 295.

Hannon, J B., et al., "The Influence of the Surface Migration of Gold on the Growth of Silicon Nanowires", *Nature 440*, (2006), 69.

Hofmann, S. , et al., "Gold Catalyzed Growth of Silicon Nano-Wires by PECVD", *J. Appl. Phys. 94*, (2003), 6005.

Hsu, J.-F , et al., "The growth of silicon nanowires by electroless plating technique of Ni catalysts on silicon substrate", *Thin Solid Films 514*, (2006), 20.

Jung, Yang-Gyoo , et al., "Effect of Oxide Thickness on the low temperature (<400C) growth of cone-shaped silicon nanowires", *J. Appl. Phys*, vol. 102, 046102, (2007).

Kim, "Electrical Characteristics of Single and Doubly Connected Ni Silicide Nanowire grown by PECVD", *Appl. Phys. Lett. 90*, (2007), 253103.

Kim, "Spontaneous Nickel Monosilicide Nanowire Formation by Metal Induced Growth", *Thin Solid Films*, 483, (2005), 60.

Lee, K S., et al., "Anomalous Growth and Characterization of Carbon-Coated Nickel Silicide Nanowires", *Chem. Phys. Lett. 384*, (2004), 215.

Lugstein, A , et al., "Ga/Au alloy catalyst for single crystal silicon-nanowire epitaxy", *Appl. Phys. Lett. 90*, (2007), 023109.

Meng, C.Y. , et al., "Doping Effects on the Ramam Spectra of Silicon Nanowires", *Phys. Rev. B 73*, (2006), 245309.

Ozaki, N , et al., "Silicon nanowhiskers grown on a hydrogen-terminated silicon {111} surface", *Appl. Phys. Lett. 73*, (1998), 3700.

Sun, X H., et al., "Germanium Nanowires: Synthesis, morphology and local structure studies", *Nanotechnology 17*, (2006), 2925.

Sun, X , et al., "Syntheseis of Germanium Nanowires on Insulator Catalyzed by Indium or Antimony", *J. Vac. Sci. Technol. B 25*, (2007), 415.

Westwater, J. , et al., "Gorwth of Silicon Nanowires via gold/silane vapor-liquid-solid reaction", *J. Vac. Sci. Technol.*, B 15, (1997), 554.

Wu, Y , et al., "Germanium Nanowire Growth via Simple Vapor Transport", *Chem. Mater. 12*, (2000), 65.

Intel Corporation, International Search Report for PCT/US2009/048636, mailed Jan. 25, 2010, (4 pages).

* cited by examiner

SELECTIVE FORMATION OF DIELECTRIC ETCH STOP LAYERS

TECHNICAL FIELD

Embodiments of the present invention are in the field of semiconductor devices, more specifically pertaining to the selective formation of dielectric etch stop layers.

BACKGROUND

Conventional transistor gate electrodes may employ a hard mask or etch stop layer, such as a silicon nitride layer, over a polysilicon gate layer to protect the gate layer during a subsequent etch, such as source/drain contact etch which might short the gate electrode if it is exposed. In the conventional subtractive process, the gate layer and then the etch stop layer are deposited in succession and etched together after a single lithographic operation to form a gate electrode stack.

As a departure from such subtractive gate electrode processes, replacement gate processes are becoming methods of choice for advanced transistor fabrication. A replacement gate process typically employs a dummy structure or mandrel around which other transistor features, such as dielectric spacers and doped substrate regions, are formed. Eventually, the mandrel is removed and replaced with a gate electrode material, such as a metal, having properties suitable for a high performance transistor.

However, replacement gate electrode processes, being additive, do not lend themselves well to incorporation of a stop layer over the gate layer. For example, the replacement gate layer may be deposited and planarized, but it is difficult to polish back a dielectric etch stop layer deposited as an overburden of the gate layer deposition. Such processes will generally leave some gate layer exposed. Alternatively, if a dielectric layer is deposited after a gate electrode material is planarized, that dielectric layer then needs to be patterned such that it provides an etch stop layer over the entire gate electrode surface while not extending a significant amount into other device regions, such as over a source or drain of the transistor. Any such patterning of the etch stop layer necessitates an additional lithography operation with associated alignment tolerances and costs.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
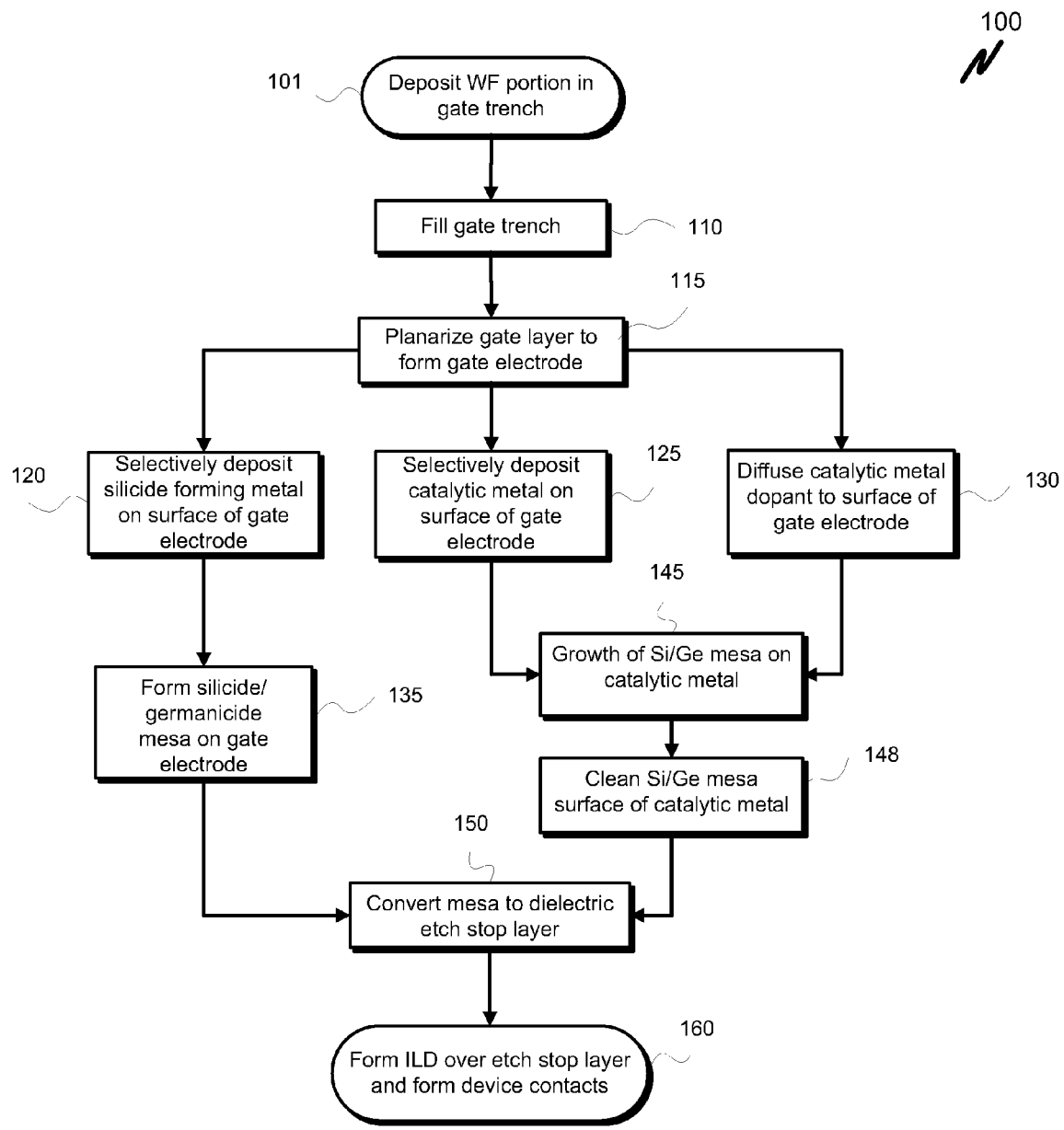
FIG. 1 is a flow diagram for forming a dielectric gate etch stop layer, in accordance with particular embodiments.

Embodiments of methods of selectively forming a dielectric etch stop layer over a patterned metal feature with an additive processes are described. Transistors incorporating such an etch stop layer over a gate electrode are also described herein with reference to figures. In particular embodiments, the selectively formed dielectric etch stop layer is formed over a patterned gate electrode and not formed over ILD adjacent to the patterned gate electrode. In accordance with certain embodiments of the present invention, a metal is selectively formed on the surface of the gate electrode which is then converted to a silicide or germanicide. In other embodiments, the metal selectively formed on the gate electrode surface is a catalytic metal which enables a catalytic growth of a silicon or germanium mesa over the gate electrode. At least a portion of the silicide, germanicide, silicon mesa or germanium mesa is then oxidized, nitridized, or carbonized to form a dielectric etch stop layer over the gate electrode only. The dielectric etch stop layer may then protect the gate electrode such that conditions for contact lithography and contact etch may be relaxed to provide greater process latitude for critical dimensions, registration and alignment of transistor contacts.

However, particular embodiments may be practiced without one or more of these specific details, or in combination with other known methods, materials, and apparatuses. For example, while described in the context of a metal gate electrode, the techniques described herein may be readily adapted to other patterned metal features, such as, but not limited to wire interconnects. In the following description, numerous specific details are set forth, such as specific materials, dimensions and material parameters etc. to provide a thorough understanding of the present invention. In other instances, well-known design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. It should also be understood that specific embodiments may be combined where not mutually exclusive.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in contact with that second member. Additionally, the relative position of one member with respect to other members is provided assuming operations are performed relative to a substrate without consideration of the absolute orientation of the substrate.

Figure 2:
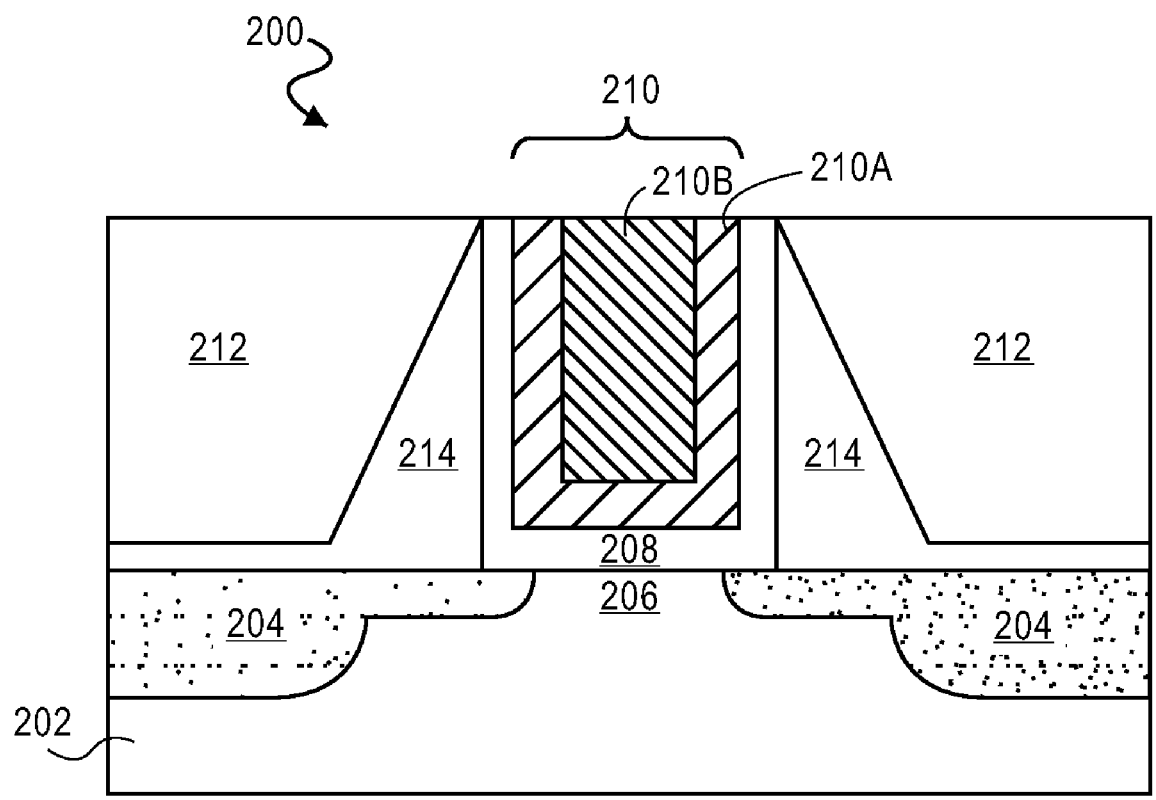
FIG. 2 illustrates a cross-sectional view of a structure after the formation of a gate electrode for which a dielectric gate etch stop layer is to be formed, in accordance with one embodiment.

Referring to FIG. 1, at operation 101 a work function material is deposited in a gate electrode trench left vacant by a placeholder or mandrel gate electrode as part of a gate replacement process. At operation 110, the gate electrode trench is substantially filled and then planarized at operation 115 to form a semiconductor device 200 in and above a substrate 202, as further shown in FIG. 2.

Substrate 202 may be composed of any material suitable for semiconductor device fabrication. In one embodiment, substrate 202 is a bulk substrate composed of a single crystal of a material which may include, but is not limited to, silicon, germanium, silicon-germanium, silicon carbide or a III-V compound semiconductor material. In another embodiment, substrate 202 includes a bulk layer with a top epitaxial layer. In a specific embodiment, the bulk layer is composed of a single crystal of a material which may include, but is not limited to, silicon, germanium, silicon-germanium, silicon carbide, a III-V compound semiconductor material and quartz, while the top epitaxial layer is composed of a single crystal layer which may include, but is not limited to, silicon, germanium, silicon-germanium and a III-V compound semiconductor material. In another embodiment, substrate 202 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium and a III-V compound semiconductor material. The insulator layer is composed of a material which may include, but is not limited to, silicon dioxide, silicon nitride and silicon oxynitride. The lower bulk layer is composed of a single crystal which may include, but is not limited to, silicon, germanium, silicon-germanium, silicon carbide, a III-V compound semiconductor material and quartz. Substrate 202 may further include dopant impurity atoms.

Gate dielectric layer 208 may be composed of any material suitable to electrically isolate gate electrode 210 from substrate 202. In one embodiment, gate dielectric layer 208 is formed by a thermal oxidation process or a chemical vapor deposition process and is composed of a material such as, but not limited to, silicon dioxide or silicon oxy-nitride. In another embodiment, gate dielectric layer 208 is formed by atomic layer deposition and is composed of a high-k dielectric material such as, but not limited to, hafnium oxide, zirconium oxide, hafnium silicate, hafnium oxy-nitride or lanthanum oxide.

Gate electrode 210 may be composed of any material suitable for use as an electrode in a semiconductor device. In accordance with an embodiment of the present invention, gate electrode 210 includes a metal. In certain embodiments, at least one metal present on the exposed surface of the gate electrode does not readily form a silicide or germanicide or readily catalyze growth of silicon or germanium. In one embodiment, gate electrode 210 includes a material such as, but not limited to a metal nitride, a metal carbide, hafnium, zirconium, titanium, tantalum, aluminum, ruthenium, palladium, platinum, cobalt, nickel, metal aluminide, a conductive metal oxide, and a combination thereof. In a specific embodiment, gate electrode 210 is composed of a multi-layer metal stack including a work-function metal 210A and a gap-fill metal 210B.

In one embodiment, dielectric sidewall spacers 214 are formed by depositing a dielectric layer over substrate 202 and a placeholder gate electrode and subsequently etching the dielectric layer with an anisotropic etch process. In a specific embodiment, dielectric sidewall spacers 214 are composed of a material which may include, but is not limited to, silicon dioxide, silicon nitride and silicon oxy-nitride. ILD 212 may be any conventional dielectric, such as, but not limited to, undoped or doped (e.g. carbon doped) glasses.

Source and drain regions 204 are formed by implanting dopant impurity atoms into substrate 202, as blocked by a placeholder gate electrode and dielectric sidewall spacers 214. Source and drain regions 204 are integrated with tip extension regions to further define channel region 206. In accordance with an embodiment of the present invention, source and drain regions 204 are N-type doped regions. In one embodiment, source and drain regions 204 are composed of phosphorous or arsenic dopant impurity atoms with a concentration in the range of $5 \times 10^{16}$-$5 \times 10^{19}$ atoms/cm$^3$. In accordance with another embodiment of the present invention, source and drain regions 204 are P-type doped regions. In one embodiment, source and drain regions 204 are composed of boron dopant impurity atoms with a concentration in the range of $5 \times 10^{16}$-$5 \times 10^{19}$ atoms/cm$^3$. In a further embodiment, source and drain regions 204 are metallized with a silicidation process.

Figure 3A:
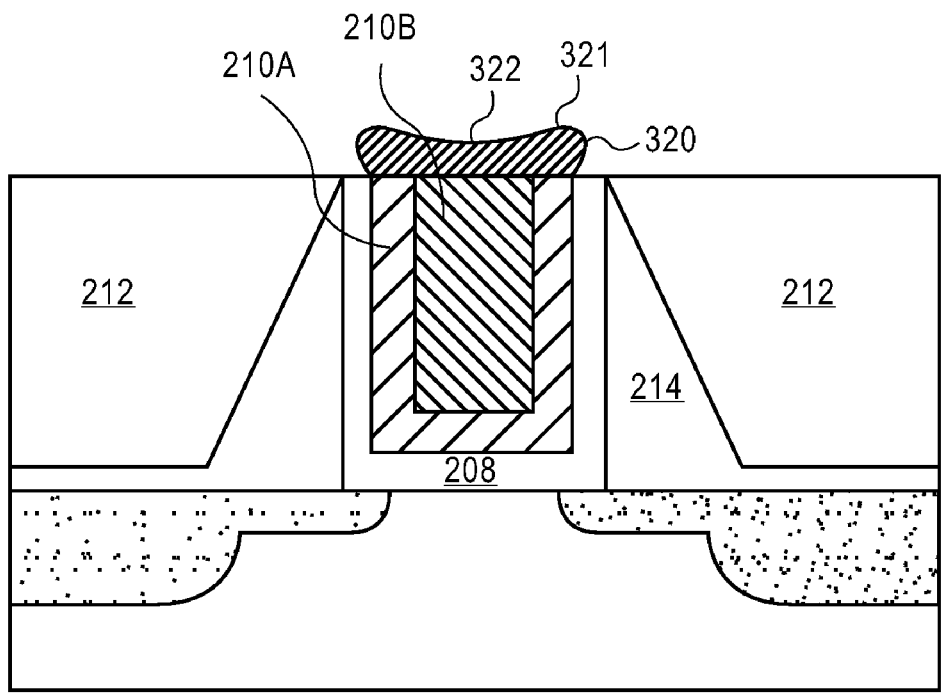
FIG. 3A illustrates a cross-sectional view of a structure after the selective formation of a metal cap on the surface of the gate electrode, in accordance with one embodiment.

As shown in FIG. 3A, subsequent to planarizing the gate layer to form the gate electrode, a metal cap 320 is selectively formed over the exposed surface of gate electrode 210. In a first embodiment, at operation 120 of FIG. 1, the metal selectively deposited on the gate electrode includes a metal capable of forming a silicide, germanicide or mixtures thereof more readily than a metal on the exposed surface of gate electrode 210. Exemplary metals capable of forming silicides include cobalt, nickel, titanium, platinum, tungsten, vanadium, palladium, copper, tantalum and aluminum. Any such metal and mixtures thereof, as well as other metals known in the art to form silicides at acceptably low process temperatures may be employed. In certain embodiments where both work-function metal 210A and gap-fill metal 210B are capable of forming a silicide, operation 120 may be omitted altogether. Thus, the need for metal cap 320 as well as the composition of metal cap 320 is dependent on the composition of the gate electrode formed at operation 115.

In an alternative embodiment, at operation 125, a catalytic metal is selectively deposited on an exposed surface of gate electrode 210 to form the metal cap 320. The catalytic metal may comprise any metal capable of catalyzing growth of silicon, germanium, or SiGe alloys more readily than a metal on the exposed surface of the gate electrode 210. Thus, the composition of metal cap 320 may again be selected based on the composition of the gate electrode. Any metal known in the art capable of catalytically enhancing a growth of silicon, germanium, or SiGe alloys may also be employed as metal cap 320. Exemplary catalytic metals include cobalt, nickel, palladium, gold, platinum, gallium, and mixtures thereof. In certain embodiments where both work-function metal 210A and gap-fill metal 210B are capable of catalyzing silicon or germanium growth, operation 125 may be omitted altogether.

In particular implementations, electrolytic plating or electroless plating may be employed to selectively deposit metal cap 320 (e.g. for the purposes of subsequently forming a silicide or catalyzing silicon growth) to a thickness of between approximately 2 nm and approximately 30 nm on the gate electrode surface. Electroless plating is a process for depositing a layer of material onto a surface by the chemical reduction of an electrolytic solution in the absence of an external electric current. The electroless plating is typically performed by immersing the substrate into an electroless bath solution.

In one implementation, a cobalt metal cap 320 is electrolessly deposited on gate electrode 210. The electroless bath solution for the plating of a cobalt layer may contain cobalt ions provided by cobalt chloride ($CoCl_2$) or cobalt sulfate ($CoSO_4$), a complexing agent such as citric acid, a buffer agent such as ammonium chloride ($NH_4Cl$) or ammonium sulfate (($NH_4)_2SO_4$), a reducing agent such as hypophosphite, dimethylaminoborane (DMAB), borohydrate, or formaldehyde, and a pH adjuster such as tetramethylammonium hydroxide (TMAH). Thus, in one exemplary implementation having a metal gate electrode, cobalt and alloys thereof, such as CoW, CoCr, CoRe, or CoMo, with minor constituents such as phosphorous (P) or boron (B) that may be deposited from the reducing agents onto the metal gate electrode surface are selectively deposited on a surface of gate electrode 210 to form metal cap 320.

In another implementation, electroless nickel and alloys thereof are selectively deposited to form metal cap 320. Any conventional electroless nickel plating process may be employed. An exemplary plating solution contains a nickel containing compound, a reducing agent such as DMAB or glyoxylic acid, a complexing agent such as carboxylic acid, citric acid, malonic acid, lactic acid, or oxalic acid, a buffer agent such as ammonium chloride, and a pH adjuster such as TMAH.

For implementations employing electroless deposition, metal cap 320 is deposited to substantially cover the exposed surface of gate electrode 210 such that the cap extends to a level higher than planarized ILD 212 and higher than dielectric sidewall spacers 214. Therefore, the sidewalls of metal cap 320 are exposed after operation 120 or 125, as depicted in FIG. 3A. In a further embodiment, the thickness of the metal cap 320 is 10% to 20% thinner near edge 321 of the exposed gate electrode surface than over longitudinal centerline 322 of the exposed gate electrode surface. In one embodiment employing electroless deposition, metal cap 320 substantially covers the exposed surface of gate electrode 210 and extends laterally beyond the sidewalls of gate electrode 210 (e.g. over gate dielectric layer 208 and/or over dielectric sidewall spacers 214) by approximately the edge thickness of metal cap 320.

Figure 3B:
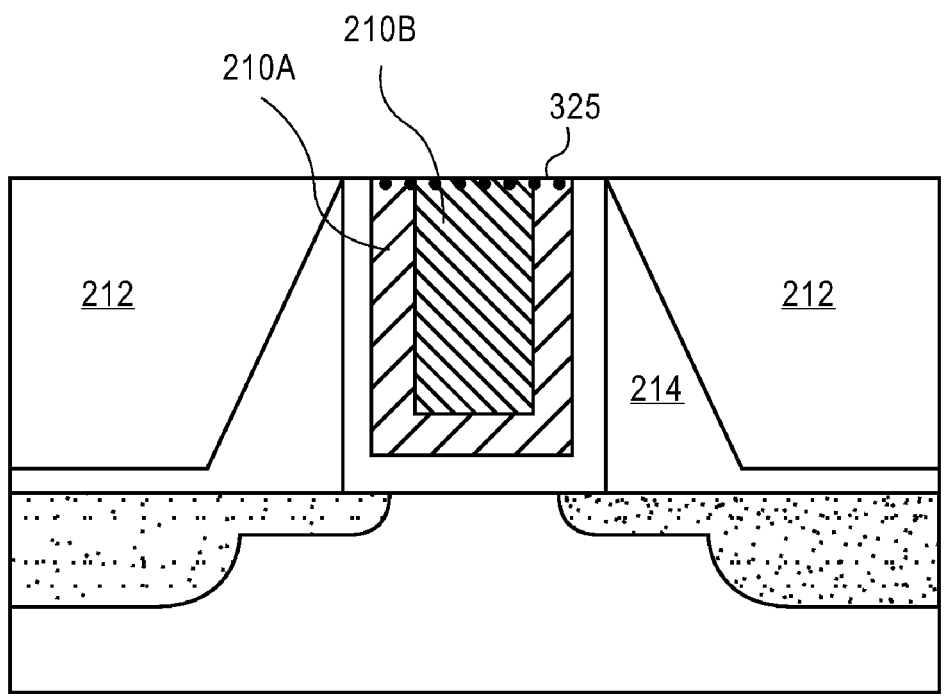
FIG. 3B illustrates a cross-sectional view of a structure after the selective formation of a catalytic metal on the surface of the gate electrode, in accordance with one embodiment.

In another implementation, at operation 130 of FIG. 1, catalytic metal dopants present in the bulk of the gate electrode are diffused to the exposed surface of the gate electrode. Referring to FIG. 3B, segregated catalytic metal layer 325 may include any of the catalytic metals employed in metal cap 320 described elsewhere herein. The "bulk" of the gate electrode from which the catalytic metal may be segregated includes work-function metal 210A and gap-fill metal 210B, as well as any gate metal seed layer that may be employed during the deposition of the gate layer (not depicted).

In one such embodiment, segregated catalytic metal layer 325 is formed with an annealing process in which substrate 202 is exposed to an elevated temperature. For example, the substrate may be exposed to a temperature of between approximately 400° C. and approximately 1000° C. for between 30 seconds and 10 minutes. Due to a lower surface energy of the catalytic metal, the catalytic metal dopants may diffuse to, and segregate at, the surface of gate electrode 210 to lower the surface free energy. Pretreatments enhancing diffusion of the catalytic metal may also be utilized. For example, in one embodiment, amorphization techniques known in the art are employed to amorphize a portion of gate electrode 210. In certain amorphization embodiments, pre-amorphization implant, such as Ge implant, may be used to damage the upper layers of gate electrode 210. Where the surface of gate electrode 210 is amorphized or damaged, the catalytic metal atoms within the amorphized portion of gate electrode 210 have a high diffusion coefficient, promoting agglomeration of metal atoms at the gate electrode surface. In further embodiments, a plasma treatment is employed, prior to annealing, to clean residues left on the surface of gate electrode 210 from gate formation and which may hinder the catalytic metal reaching the surface. The plasma treatment may include 50-10000 sccm of at least one of $H_2$, $NH_3$ or $N_2$ at a pressure of 0.5-10 Torr, energized with approximately 50-800 W of RF power.

The thickness of segregated catalytic metal layer 325 is dependent on both the concentration of catalytic metal dopant in the bulk of the gate electrode and the conditions under which the dopant is diffused. In one embodiment, where just gap-fill metal 210B contains the catalytic metal "as-deposited," gap-fill metal 210B comprises between approximately 1% and 50% catalytic metal dopant. In particular embodiments, segregated catalytic metal layer 325 has a thickness between approximately 1 nm and approximately 50 nm. The catalytic metal dopant concentration within segregated catalytic metal layer 325 may be anywhere between 1% and 100% with the higher concentrations being of relatively lesser thickness and proximate to the exposed gate electrode surface.

In particular embodiments, as depicted in FIG. 3B, segregated catalytic metal layer 325 does not form a cap having topography above planarized dielectric sidewall spacer 214 or ILD, but rather forms metal nanoparticles at the surface of gate electrode 210. Segregated catalytic metal layer 325 may therefore remain embedded in dielectric, adjacent to dielectric sidewall spacer 214. Thus, relative to operations 120 and 125 where metal cap 320 is selectively deposited, the substrate surface following operation 130 may remain advantageously planar.

Figure 4A:
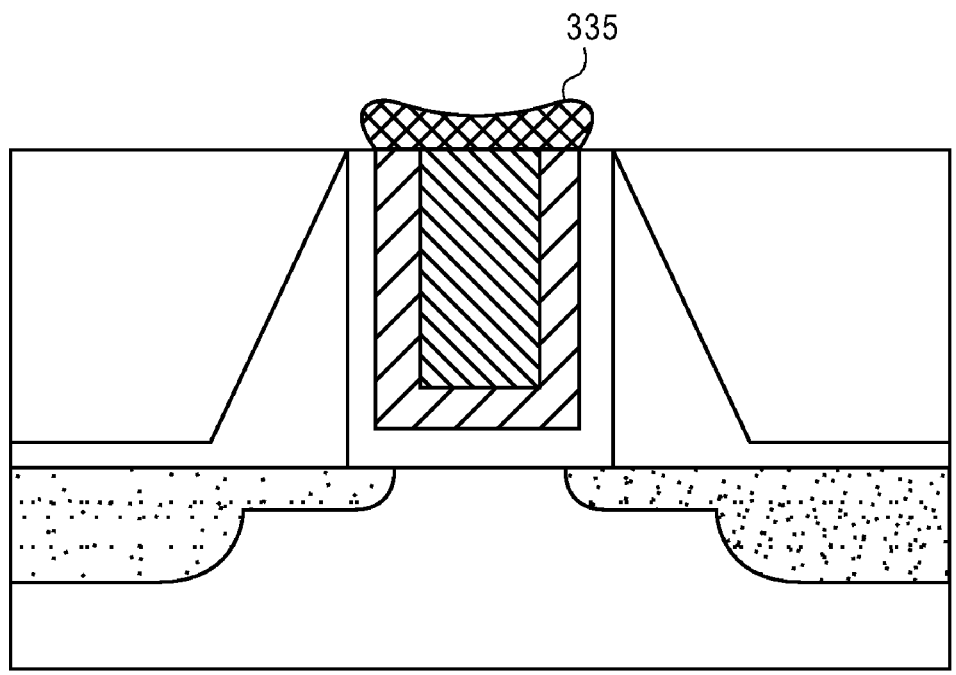
FIG. 4A illustrates a cross-sectional view of a mesa after a metal cap is silicided or germanicided, in accordance with one embodiment.

Returning to FIG. 1, at operation 135, at least a portion of metal cap 320 formed at operation 120 is converted to a metal silicide and/or metal germanicide mesa 335, as depicted in FIG. 4A. Generally, any process known in the art to form a silicide or germanicide of the particular metal selectively deposited at operation 120 may be utilized at operation 135. The process selected is dependent on both the cap metal composition and desired thickness of the silicide/germanicide shell to be formed from metal cap 320. The silicide/germanicide shell thickness may be between 50% and 100% of the thickness of metal cap 320. As depicted in FIG. 4A, the entire thickness of metal cap 320 is converted to metal silicide and/or metal germanicide mesa 335. In other embodiments, where complete conversion does not occur, the thickness of metal silicide and/or metal germanicide mesa 335 is somewhat less than the thickness of metal cap 320 with metal silicide and/or metal germanicide mesa 335 formed on both the top surface and sidewalls of metal cap 320. Furthermore, the silicide thickness on the top surface may be different than on the sidewall.

In one embodiment, silicidation/germanicidation of metal cap 320 is performed via a gas phase surface reaction of a silicon hydride or germanium hydride gas. Exemplary source gases include silane ($SiH_4$), MonoMethylSilane, Tri-methyl silane (TMS) and the like. In one implementation, a chemical vapor deposition (CVD) process is employed to react metal cap 320 with the hydride gas. In another implementation, a plasma enhanced CVD (PECVD) process is employed to react metal cap 320 with the hydride source gas. In one exemplary embodiment, a cobalt silicide mesa 335 is formed from a cobalt metal cap 320. In another exemplary embodiment, a nickel silicide mesa 335 is formed from a nickel metal cap 320.

In an alternate embodiment, silicidation/germanicidation of metal cap 320 is performed via a solid phase reaction wherein a conventional deposition process is used to form an amorphous silicon film on metal cap 320 and over ILD 212 (not depicted). A thermal treatment is then performed to react a portion of the amorphous silicon film with metal cap 320 to form metal silicide and/or metal germanicide mesa 335. The unreacted amorphous silicon is then stripped off the ILD 212 using a conventional wet or dry chemical strip process. In one exemplary process, between approximately 5 nm and 10 nm of amorphous silicon is deposited on a cobalt metal cap 320 and annealed at between 500° C. and 850° C. to form a cobalt silicide mesa 335.

In another embodiment, where the gate layer deposited at operation 115 is capable of forming a silicide/germanicide, and operation 120 is therefore omitted, a portion of the gate electrode is converted to a silicide or germanicide at operation 145 using any of the gas phase or solid phase techniques described elsewhere herein for forming metal silicide and/or metal germanicide mesa 335. The portion of the gate electrode converted may be of approximately the same thicknesses provided for metal silicide and/or metal germanicide mesa 335. In certain embodiments, the portion converted may be anywhere from 10-70% of the total gate electrode thickness (being limited by the onset of deleterious impacts to gate performance). In such embodiments, gate electrode 210 may remain advantageously planar with ILD 212.

Returning to FIG. 1, for embodiments where a catalytic metal is selectively formed (e.g. by selective deposition at operation 125 or surface segregation at operation 130), a nanomesa including silicon and/or germanium is catalytically grown at operation 145. Generally, any method of catalytically enhanced silicon or germanium growth may be employed to form the silicon and/or germanium mesa 345 of FIG. 4B.

In particular embodiments, a metal-catalyzed vapor-liquid-solid (VLS) growth process is employed. While not bound by theory, the mechanism of the VLS process is generally understood to include dissolving, in the catalytic metal, silicon or germanium from a source gas. The dissolved silicon/germanium then diffuses through the catalytic metal, which is typically a liquid at the process temperature, and precipitates at the surface of gate electrode 210. During the growth process, at least a portion of the catalytic metal (e.g., 350A) "floats" above the silicon/germanium grown at the surface of the gate electrode 210 while another portion of the catalytic metal (e.g., 350B) may be expected to remain at interface of gate electrode 210 and/or germanium silicon and/or germanium mesa 345.

While any VLS method known in the art for the particular catalytic metal utilized in operation 125 or operation 130 may be employed, one exemplary PECVD process includes approximately 50-20,000 sccm of inert, such as He, Ar and Ne, and 1-1000 sccm silicon or germanium source gas, such as $SiH_4$, $Si_3H_8$, MonoMethylSilane and $GeH_4$, at a pressure of approximately 0.5-10 Torr and a temperature of approximately 200-400° C. energized with approximately 5-500 W of RF power. An exemplary CVD process includes those same conditions in the absence of RF power.

Both the thickness and the morphology of silicon and/or germanium silicon and/or germanium mesa 345 grown by VLS are dependent on the process conditions and the nature of segregated catalytic metal layer 325. In particular embodiments, silicon and/or germanium mesa 345 is comprised of a plurality of closely spaced wires substantially covering the surface of gate electrode 210. In certain embodiments, the thickness of silicon and/or germanium mesa 345 is between approximately 1-10 nm extending upward from the catalyzed surface of gate electrode 210.

Returning to FIG. 1, subsequent to operation 145, catalytic metal portion 350A remaining on the surface of silicon and/or germanium mesa 345 may be removed at operation 148. Any wet chemical clean known in the art to be suitable for removal of the particular catalytic metal employed may be utilized at operation 145. In certain other embodiments, operation 145 is omitted and residual catalytic metal is allowed to remain on the exposed surface of silicon and/or germanium mesa 345.

Figure 4B:
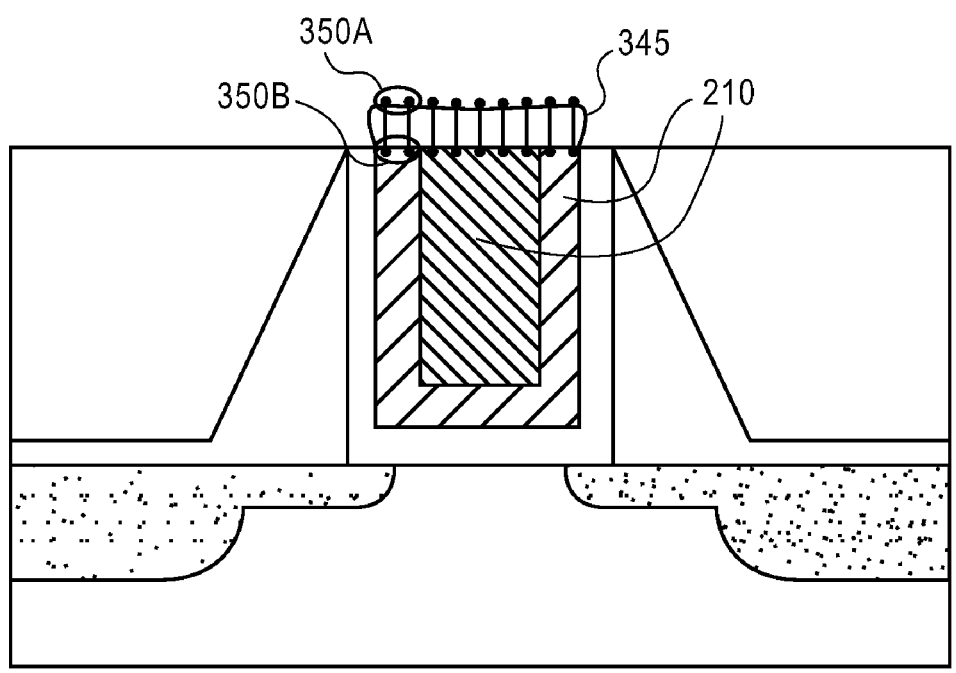
FIG. 4B illustrates a cross-sectional view of a structure after catalytic growth of a mesa over the gate electrode surface, in accordance with one embodiment.

At operation 150, a dielectric etch stop layer is formed over the gate electrode by converting to a dielectric at least a portion of either metal silicide and/or metal germanicide mesa 335 of FIG. 4A or silicon and/or germanium mesa 345 of FIG. 4B. In a first embodiment, a portion of silicide mesa 335 is converted to dielectric etch stop layer 350 depicted in FIG. 5A. Dielectric etch stop layer 350 may comprise a dielectric such as, but not limited to, a silicon nitride, silicon dioxide, silicon oxynitride, silicon carbide, or silicon carbon nitride, depending on the process performed at operation 150.

Figure 5A:
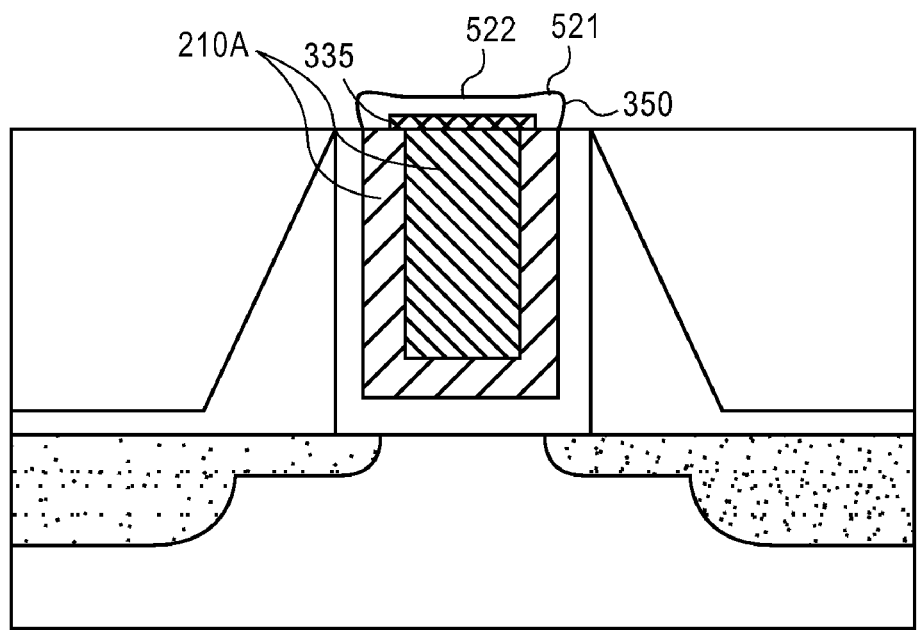
FIG. 5A illustrates a cross-sectional view of a structure after a dielectric etch stop layer is formed from a silicided or germanicided metal mesa over the gate electrode, in accordance with one embodiment.

In general, any process known in the art capable of forming an electrically insulative layer from silicide and/or germanicide mesa 335 may be employed at operation 150. In one embodiment, a nitridation process is performed. In such a process, a surface layer of metal silicide and/or metal germanicide mesa 335 (e.g. cobalt silicide) is converted to a nitride dielectric etch stop layer 350. Nitride dielectric etch stop layer 350 will be predominantly silicon nitride or germanium nitride but may include some residual nitrided metal. In an exemplary cobalt silicide embodiment, cobalt silicide is nitrided at a process temperature of approximately 400° C. to draw silicon out of the cobalt silicide ($CoSi_x$) and form a silicon nitride ($SiN_x$) dielectric etch stop layer 350 as a "shell" or "crust" surrounding an inner metal core 336 of cobalt or silicon depleted cobalt silicide. This occurs because cobalt nitride (CoN) is not stable at 400° C. and decomposes to Co and $N_2$. Similar phenomena may also be observed in the other metal silicides or metal germanicides described herein. Because of the isotropic dielectric formation, unless the entire silicide and/or germanicide mesa 335 is converted, the shell structure of dielectric etch stop layer 350 may be characterized by a greater thickness, T, over an edge 521 of gate electrode 210 than over a longitudinal centerline 522 of gate electrode 210, as depicted in FIG. 5A.

In one specific implementation, the nitridation of operation 150 may be performed with a nitrogen source gas, such as, but not limited to, $N_2$ or $NH_3$, energized into a plasma at approximately 200-450° C. to convert approximately 1-10 nm of a metal silicide mesa 335 to a silicon nitride dielectric etch stop layer. In another implementation, a plasma nitridation is performed at room temperature to convert approximately 1-5 nm of a metal silicide mesa 335 to a silicon nitride dielectric etch stop layer. In another embodiment, a nitrogen anneal using a nitrogen source gas, such as $N_2$ and $NH_3$, is performed at approximately 600-850° C. to convert approximately 5-15 nm of silicide mesa 335 to a silicon nitride dielectric etch stop layer. In still another embodiment, nitrogen is implanted by ion beam to convert 1-10 nm of silicide mesa 335 to a silicon nitride dielectric etch stop layer. Similar process may be employed with source gases suitable to form a dielectric etch stop layer including the other dielectrics described elsewhere herein.

Figure 5B:
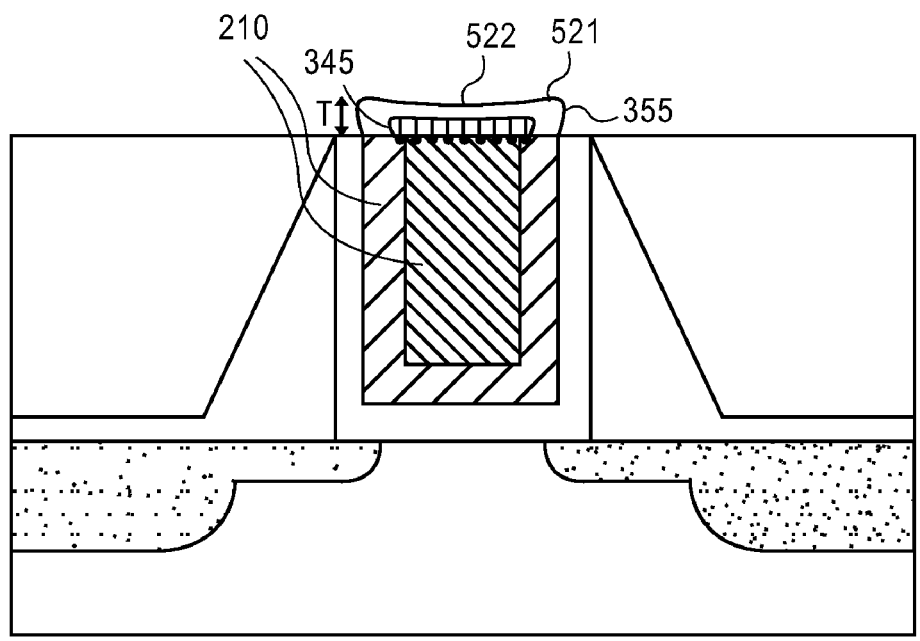
FIG. 5B illustrates a cross-sectional view of a structure after a dielectric etch stop layer is formed from a mesa over the gate electrode, in accordance with one embodiment.

In another embodiment, at operation 150, a portion of silicon and/or germanium mesa 345 of FIG. 4B is converted to dielectric etch stop layer 355 depicted in FIG. 5B. Dielectric etch stop layer 355 may comprise a dielectric such as, but not limited to, a silicon nitride, silicon dioxide, silicon oxynitride, silicon carbide, or silicon carbon nitride. For those implementations where operation 148 is omitted, any residual catalytic metal on the surface of silicon and/or germanium mesa 345 may also be oxidized at this time.

Any process known in the art capable of forming an electrically insulative layer from silicon and/or germanium mesa 345 may be employed at operation 150. For example, a nitridation or oxidization may be performed. In certain embodiments, commonly known oxidation processes may be employed to form a dielectric etch stop layer 355 of silicon oxide and/or germanium oxide. In other embodiments, a carbonizing process may be employed to convert at least a portion of silicon and/or germanium mesa 345 into a dielectric layer (e.g., silicon carbide). In an exemplary implementation, silicon and/or germanium mesa 345 is nitrided by at least one of the processes described elsewhere herein for nitriding the metal silicide and/or metal germanicide mesa 335. For such an implementation, the thickness of dielectric etch stop layer 355 may be greater than the thickness of dielectric etch stop layer 350 formed under the same conditions. Depending on the method of nitriding, the thickness of dielectric etch stop layer 355 may range from approximately 5-15 nm.

In embodiments where there is isotropic formation of dielectric etch stop layer 355, unless the entire silicon and/or germanium mesa 345 is converted, the shell structure of dielectric etch stop layer 355 may be characterized by a greater thickness, T, over an gate electrode edge 521 than over a gate electrode longitudinal centerline 522, as depicted in FIG. 5B. In other embodiments, where dielectric etch stop layer 355 is formed anistropically (e.g., plasma enhanced or beam implant methods), the shell structure of dielectric etch stop layer 355 may be characterized by a greater thickness, T, over gate electrode longitudinal centerline 522 than over an gate electrode edge 521.

Figure 6A:
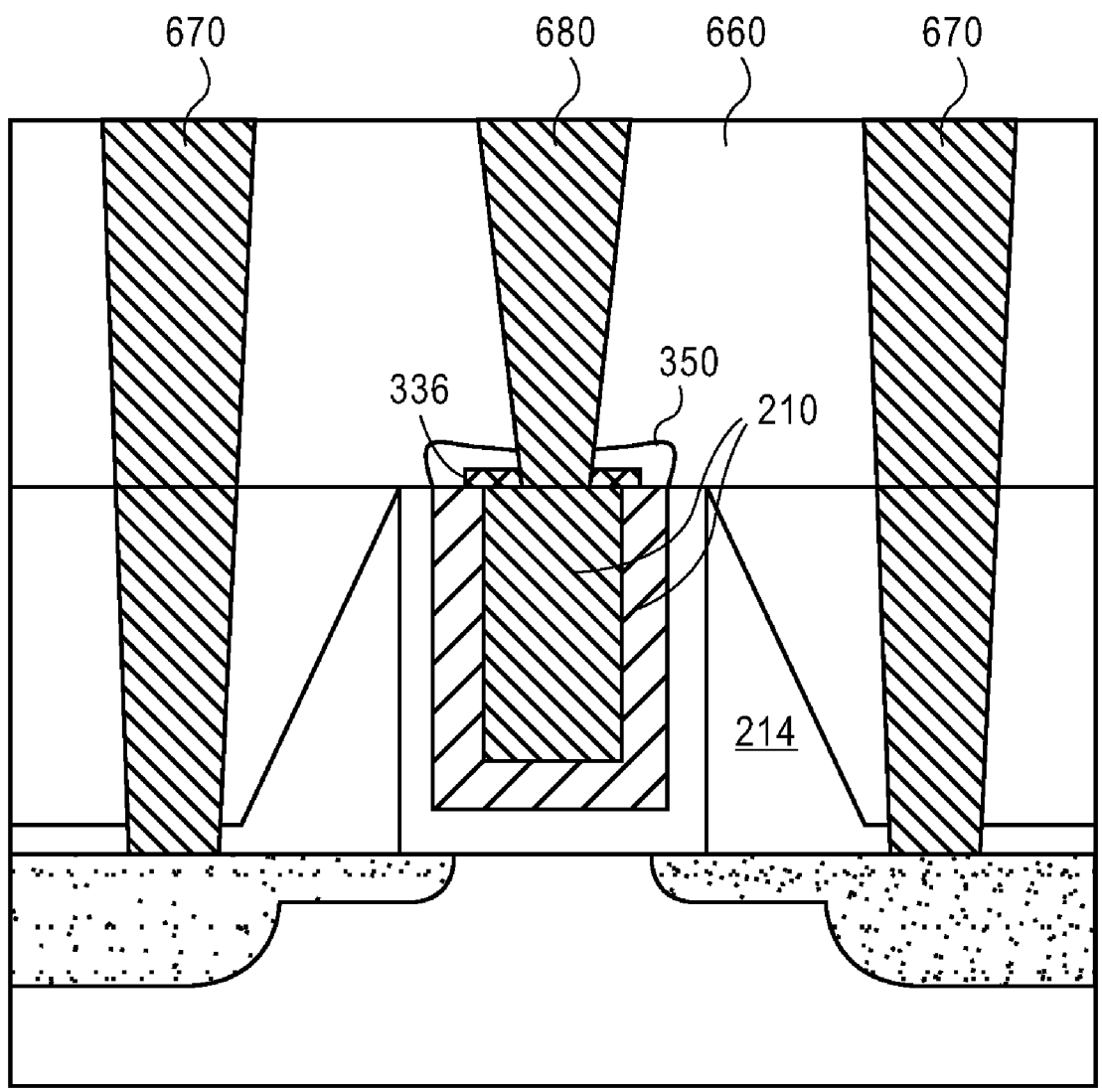
FIG. 6A illustrates a cross-sectional view of a structure after contacts are opened in an inter-layer dielectric (ILD) formed on a dielectric etch stop layer over the gate electrode, in accordance with one embodiment.
Figure 6B:
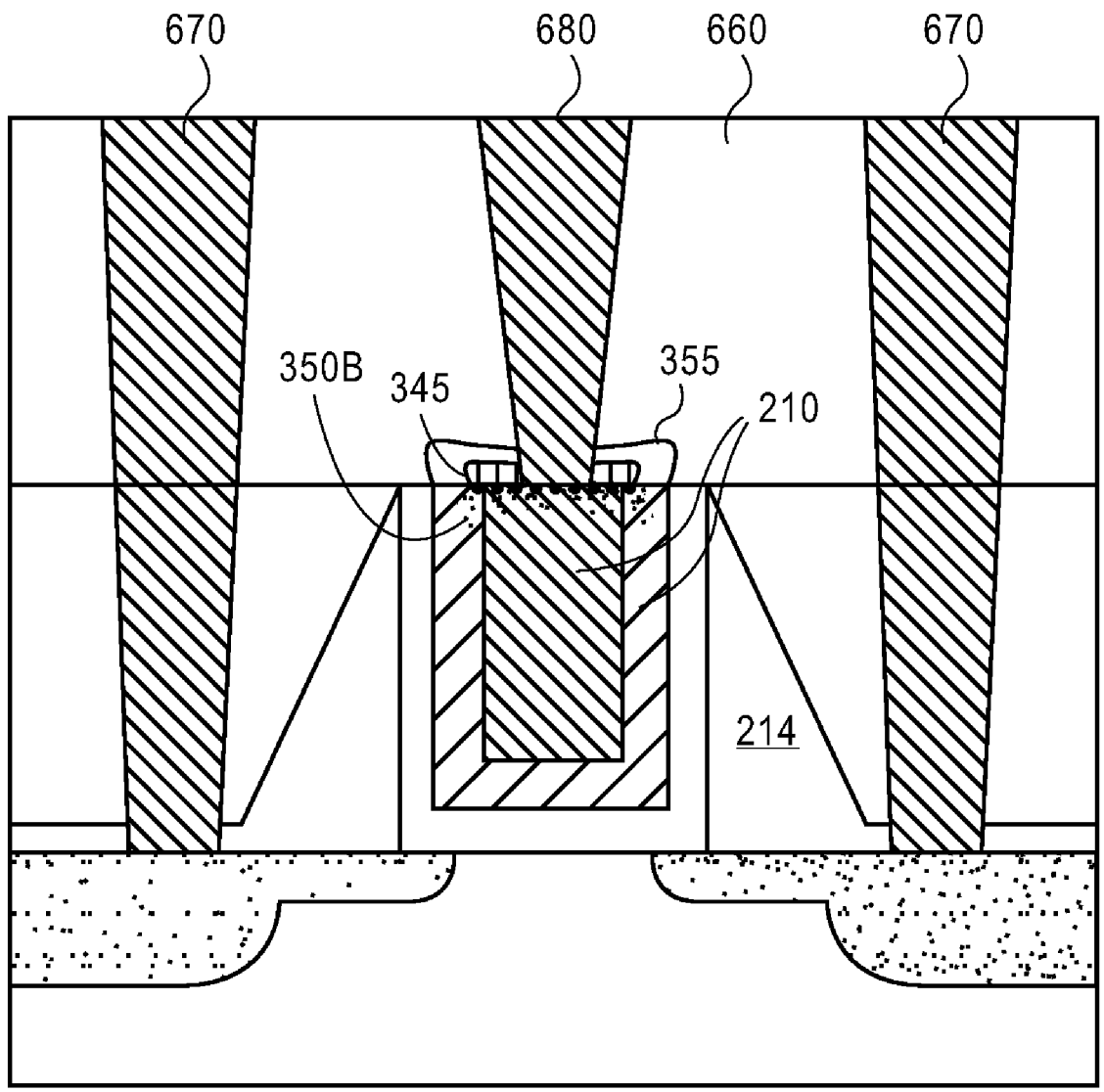
FIG. 6B illustrates a cross-sectional view of a structure after contacts are opened in an ILD formed on a dielectric etch stop layer over the gate electrode, in accordance with one embodiment.

Returning to FIG. 1, at operation 160, ILD 660 may then be formed over dielectric etch stop layer 350 or 355, as depicted in FIGS. 6A and 6B, respectively. ILD 660 may comprise any dielectric known in the art, such as any of those previously described for ILD 212, and may be deposited by any conventional method. In one particularly advantageous embodiment, ILD 660 and ILD 212 both include materials distinct from those of dielectric etch stop layer 350 or 355. Device contacts 670 of any convention metallurgy may then be opened to source/drains 204 along with device contact 680 to gate electrode 210.

As depicted in FIG. 6A, device contact 680 intersects dielectric etch stop layer 350 such that differences in etch depth between device contacts 670 and 680 may be accounted for with a selectively of the contact etch between dielectric etch stop layer 355 and ILD 660 and/or ILD 212. FIG. 6B depicts a similar condition for embodiments employing dielectric etch stop layer 355. As further depicted in FIGS. 6A and 6B, dielectric etch stop layers 350 and 355 in combination with dielectric sidewall spacers 214 completely encase gate electrode 210 in electrically insulating materials which may be highly resistant to the particular etch process employed to open device contacts 670 and 680. This high etch resistance may be utilized to relax the etch process window and thereby reduce etch bias, improve profile control, etc.

Furthermore, where two separate masked etches are utilized to form device contact 670 and device contact 680, dielectric etch stop layer 350 may prevent contact 670, if misaligned to be over gate electrode 210, from shorting gate electrode 210 to source/drains 204. Such improvements may then be translated into improved critical dimension and registration budgets.

As depicted in FIG. 6B, depending on the extent of silicidation/germanicidation performed at operation 135, inner metal core 336 may remain in the device structure as an artifact and may either be etched through during a step in the contact etch or may be utilized as a low resistance contact. Similarly, as depicted in FIG. 6B, silicon and/or germanium mesa 345 may remain in the device structure and may also be etched through during a step in the contact etch. As further depicted, catalytic metal portion 350B may also remain as a process artifact in the device structure.

Thus, selective formation of a dielectric etch stop layer has been disclosed. One or more of the embodiments described in detail may be employed to selectively cover a gate electrode with a dielectric etch stop layer. Although the present invention has been described in language specific to structural features or methodological acts, it is to be understood that the invention defined in the appended claims is not necessarily limited to the specific features or acts described. The specific features and acts disclosed are to be understood merely as particularly graceful implementations of the claimed invention provided in an effort to illustrate rather than limit the present invention.

What is claimed is:

1. A method of selectively forming a dielectric etch stop layer over a patterned metal feature comprising:
   exposing a surface of the metal feature;
   forming a catalytic metal on a surface of the metal feature;
   performing a catalytically enhanced growth of a mesa over the metal feature, the mesa comprising silicon, germanium or a mixture thereof; and
   converting at least a portion of the mesa into a dielectric to form the dielectric etch stop layer.

2. The method as in claim 1, wherein the mesa is grown by exposing the catalytic metal to a hydrogentated silicon source gas in a vapor-liquid-solid (VLS) growth process.

3. The method as in claim 2, wherein the catalytic metal comprises at least one of: gallium, palladium, platinum and cobalt.

4. The method as in claim 2, further comprising removing the catalytic metal from the surface of the mesa with a wet etchant of the catalytic metal.

5. The method as in claim 1, wherein selectively forming the catalytic metal on the surface of the metal feature further comprises:
   diffusing a metal dopant from the metal feature bulk to the surface of the metal feature; and
   growing, with the metal dopant as a catalyst, a silicon mesa or germanium mesa over the metal feature.

6. The method as in claim 1, wherein selectively forming the catalytic metal on the surface of the metal feature further comprises: selectively depositing, on the metal feature, a metal cap comprising the catalytic metal.

7. The method as in claim 6, where the catalytic metal catalyzes growth of silicon, germanium, or alloys thereof more readily than does the metal feature.

8. The method as in claim 1, wherein converting the mesa to a dielectric further comprises oxidizing, nitridizing or carbonizing at least an outer shell of the mesa with at least one of an annealing process or plasma process.

9. The method as in claim 1, wherein exposing the metal feature comprises polishing back a gate metal layer to form a planarized gate electrode.

10. A method of selectively forming a dielectric etch stop layer over a patterned metal feature comprising:
    exposing a surface of the metal feature;
    diffusing a metal dopant from the metal feature bulk to the surface of the metal feature;
    growing, with the metal dopant as a catalyst, a silicon mesa or germanium mesa over the metal feature to selectively form the mesa over the exposed surface of the metal feature; and
    converting at least a portion of the mesa into a dielectric to form the dielectric etch stop layer.

11. The method as in claim 10, wherein the mesa is grown by exposing the catalytic metal dopant to a hydrogentated silicon source gas.

12. The method as in claim 10, wherein the catalytic metal dopant comprises at least one of: gallium, palladium, platinum and cobalt.

13. The method as in claim 10, further comprising cleaning the surface of the mesa with a wet etchant of the catalytic metal dopant.

14. The method as in claim 10, wherein the metal feature bulk comprises any of a work-function metal, a gap-fill metal, or a metal seed layer of the metal feature.

15. The method as in claim 10, wherein diffusing the metal dopant from the metal feature bulk to the surface of the metal feature further comprises forming a segregated catalytic layer having a thickness between approximately 1 nm and approximately 50 nm.

16. The method as in claim 15, wherein forming the segregated catalytic further comprises:
    amorphizing at least a portion of the gate electrode; and
    annealing at a temperature between approximately 400° C. and approximately 1000° C.

17. The method as in claim 15, wherein the gap-fill metal comprises between approximately 1% and 50% catalytic metal dopant.

18. A method of selectively forming a dielectric etch stop layer over a patterned metal feature comprising:
    exposing a surface of the metal feature;
    selectively depositing, on the exposed surface, a metal cap;
    converting at least a portion of the metal cap to at least one of a silicide, germanicide or
    mixture thereof, wherein the converting is performed via a solid phase reaction further comprising:
        depositing an amorphous film on the metal cap and over a dielectric surrounding the metal feature;
        performing a thermal treatment to react a portion of the amorphous film with the
    metal cap; and
        stripping off the unreacted amorphous film from the surrounding dielectric to selectively form a mesa comprising silicon or germanium over the exposed surface of the metal feature; and
    converting at least a portion of the mesa into a dielectric to form the dielectric etch stop layer.

19. The method as in claim 18, wherein the metal cap comprises at least one of: gallium, palladium, platinum and cobalt, and wherein the amorphous film comprises silicon.

* * * * *